United States Patent
Deak

(10) Patent No.: US 7,160,738 B2
(45) Date of Patent: Jan. 9, 2007

(54) MAGNETIC ANNEALING SEQUENCES FOR PATTERNED MRAM SYNTHETIC ANTIFERROMAGNETIC PINNED LAYERS

(75) Inventor: James G. Deak, Eden Prairie, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/415,601

(22) Filed: May 1, 2006

(65) Prior Publication Data

US 2006/0192304 A1  Aug. 31, 2006

Related U.S. Application Data

(62) Division of application No. 10/764,832, filed on Jan. 26, 2004, now Pat. No. 7,083,988.

(51) Int. Cl.
*H01L 21/8239* (2006.01)
(52) U.S. Cl. .................. 438/3; 438/5; 257/E21.665
(58) Field of Classification Search ............. 438/3, 438/5, FOR. 141, FOR. 333; 257/E21.665
See application file for complete search history.

(56) References Cited

U.S. PATENT DOCUMENTS

| | | | |
|---|---|---|---|
| 4,731,757 A | 3/1988 | Daughton et al. | |
| 5,650,887 A | 7/1997 | Dovek et al. | |
| 5,841,692 A | 11/1998 | Gallagher et al. | |
| 5,862,022 A | 1/1999 | Noguchi et al. | |
| 6,027,948 A | 2/2000 | Jensen et al. | |
| 6,048,739 A | 4/2000 | Hurst et al. | |
| 6,351,355 B1 | 2/2002 | Min et al. | |
| 6,413,788 B1 | 7/2002 | Tuttle | |
| 6,707,084 B1 | 3/2004 | Katti et al. | |
| 6,744,086 B1 | 6/2004 | Daughton et al. | |
| 6,780,655 B1 * | 8/2004 | Mattson | 438/3 |
| 6,818,961 B1 | 11/2004 | Rizzo et al. | |
| 6,911,710 B1 * | 6/2005 | Nickel et al. | 257/421 |
| 2003/0103299 A1 | 6/2003 | Saito | |
| 2003/0179520 A1 | 9/2003 | Hasegawa | |
| 2004/0115478 A1 | 6/2004 | Qian et al. | |

OTHER PUBLICATIONS

Brown, W.F., et al., "Structure and energy of one-dimensional domain walls in ferromagnetic thin films," Journal of Applied Physics, Apr. 1965, pp. 1380-1386, vol. 36, No. 4.
Schrag, B.D., et al., "Neel 'orange-peel' coupling in magnetic tunneling junction devices," Applied Physics Letters, Oct. 9, 2000, pp. 2373-2375, vol. 77, No. 15.
Shi et al., "End domain states and magnetization reversal in submicron magnetic structures," IEEE Transactions on Magnetics, Jul. 1998, pp. 997-999, vol. 34, No. 4.

* cited by examiner

*Primary Examiner*—Matthew Smith
*Assistant Examiner*—Joannie Adelle Garcia
(74) *Attorney, Agent, or Firm*—Knobbe, Martens, Olson & Bear LLP

(57) ABSTRACT

A method is provided for fabricating a fixed layer for a MRAM device. The method includes providing the fixed layer. The fixed layer includes an antiferromagnetic pinning layer over a substrate and a ferromagnetic pinned layer over the pinning layer, the pinned layer having a first thickness. The fixed layer further includes a spacer layer over the pinned layer, and a ferromagnetic reference layer over the spacer layer, the reference layer having a second thickness. The method further includes annealing the fixed layer using a temporal temperature/magnetic field profile, the profile having a maximum magnetic field magnitude ($H_{anneal}$). The profile is selected based on the first thickness of the pinned layer and the second thickness of the reference layer.

17 Claims, 8 Drawing Sheets

MAGNETIC ANNEALING SEQUENCES FOR PATTERNED MRAM SYNTHETIC ANTIFERROMAGNETIC PINNED LAYERS

REFERENCE TO RELATED APPLICATIONS

This application is a divisional of U.S. Application Ser. No. 10/764,832, filed Jan. 26, 2004, now U.S. Pat. No. 7,083,988, which is incorporated herein by reference.

BACKGROUND OF THE INVENTION

1. Field of the Invention

The present invention relates generally to memory devices, and more particularly, to a method of fabricating the fixed layer of a magnetic random-access memory (MRAM) device.

2. Description of the Related Art

Magnetic random-access memory (MRAM) cells provide non-volatile memory and typically include a fixed layer and a free layer in a stack configuration. The fixed layer can comprise several sublayers and is magnetized to have a fixed magnetization vector under circuit operation conditions. The free layer has a magnetization vector which is switchable in circuit operation between two opposite orientations which are parallel and anti-parallel to the magnetization vector of the fixed layer. Writing information to the MRAM cell corresponds to magnetizing the free layer into either the parallel or anti-parallel configuration. The resistance of the MRAM cell in the parallel state is different from that in the anti-parallel state, and this resistive difference can be detected to read information from the MRAM cell.

A general configuration for an MRAM cell 2 over a substrate 10 is schematically illustrated in FIG. 1. The fixed layer 20 comprises an antiferromagnetic pinning layer 22 over the substrate 10, a ferromagnetic pinned layer 24 having a first thickness $t_1$ on the pinning layer 22, an antiferromagnetic spacer layer 26 over the pinned layer 24, and a ferromagnetic reference layer 28 having a second thickness $t_2$ over the spacer layer 26. This configuration of the fixed layer 20 is an example of a structure typically called a synthetic antiferromagnetic (SAF) layer. The free layer 30 comprises a ferromagnetic material and is spaced from the fixed layer 20 by a non-magnetic tunneling layer 40 (e.g., $AlO_x$) in the example of a tunneling magnetoresistive (TMR) design.

The orientations of the magnetization vectors of the pinned layer 24 and the reference layer 28 of the fixed layer 20 are set during the fabrication process. Often, this orientation is accomplished by an annealing sequence in which the MRAM cell 2 is cooled through a blocking temperature of the antiferromagnetic material of the pinning layer 22 while a magnetic field is applied to the MRAM cell 2. Above the blocking temperature, the spins of the atoms in the pinning layer 22 are free to orient under the influence of the magnetic field so as to minimize the energy of the pinning layer 22. Below the blocking temperature, the spin configuration of the pinning layer 22 is locked in. Since the pinned layer 24 is exchange coupled to the pinning layer 22, and the reference layer 28 is exchange coupled to the pinned layer 24 via the spacer layer 26, this procedure of field cooling (cooling the fixed layer 20 from above the blocking temperature to room temperature while in an applied field) sets the orientation of the magnetization of the fixed layer 20.

SUMMARY OF THE INVENTION

According to one aspect of the present invention, a method is provided for fabricating a fixed layer for a MRAM device. The method comprises providing the fixed layer. The fixed layer comprises an antiferromagnetic pinning layer over a substrate and a ferromagnetic pinned layer over the pinning layer, the pinned layer having a first thickness. The fixed layer further comprises a spacer layer over the pinned layer, and a ferromagnetic reference layer over the spacer layer, the reference layer having a second thickness. The method further comprises annealing the fixed layer using a temporal temperature/magnetic field profile, the profile having a maximum magnetic field magnitude ($H_{anneal}$). The profile is selected based on the first thickness of the pinned layer and the second thickness of the reference layer.

According to another aspect of the present invention, a method is provided for fabricating a fixed layer for a MRAM device. The method comprises providing the fixed layer. The fixed layer comprises an antiferromagnetic pinning layer over a substrate and a ferromagnetic pinned layer over the pinning layer, the pinned layer having a first thickness. The fixed layer further comprises a spacer layer over the pinned layer, and a ferromagnetic reference layer over the spacer layer, the reference layer having a second thickness. The method further comprises selecting magnetic field conditions for setting a magnetic orientation of the fixed layer. The magnetic field conditions are selected based on the first thickness of the pinned layer and the second thickness of the reference layer.

According to still another aspect of the present invention, a method is provided for fabricating a MRAM device. The method comprises providing the fixed layer. The fixed layer comprises an antiferromagnetic pinning layer over a substrate and a ferromagnetic pinned layer over the pinning layer, the pinned layer having a first thickness. The fixed layer further comprises a spacer layer over the pinned layer, and a ferromagnetic reference layer over the spacer layer, the reference layer having a second thickness. The method further comprises annealing the fixed layer using a temporal temperature/magnetic field profile. The profile is selected based on the first thickness of the pinned layer and the second thickness of the reference layer.

According to still another aspect of the present invention, a method is provided for fabricating a MRAM device. The method comprises providing a synthetic antiferromagnetic layer having a ferromagnetic pinned layer having a first thickness and a ferromagnetic reference layer having a second thickness. The method further comprises annealing the synthetic antiferromagnetic layer using a temporal temperature/magnetic field profile. The profile is selected based on the first thickness and the second thickness.

DETAILED DESCRIPTION OF THE PREFERRED EMBODIMENT

Figure 1:
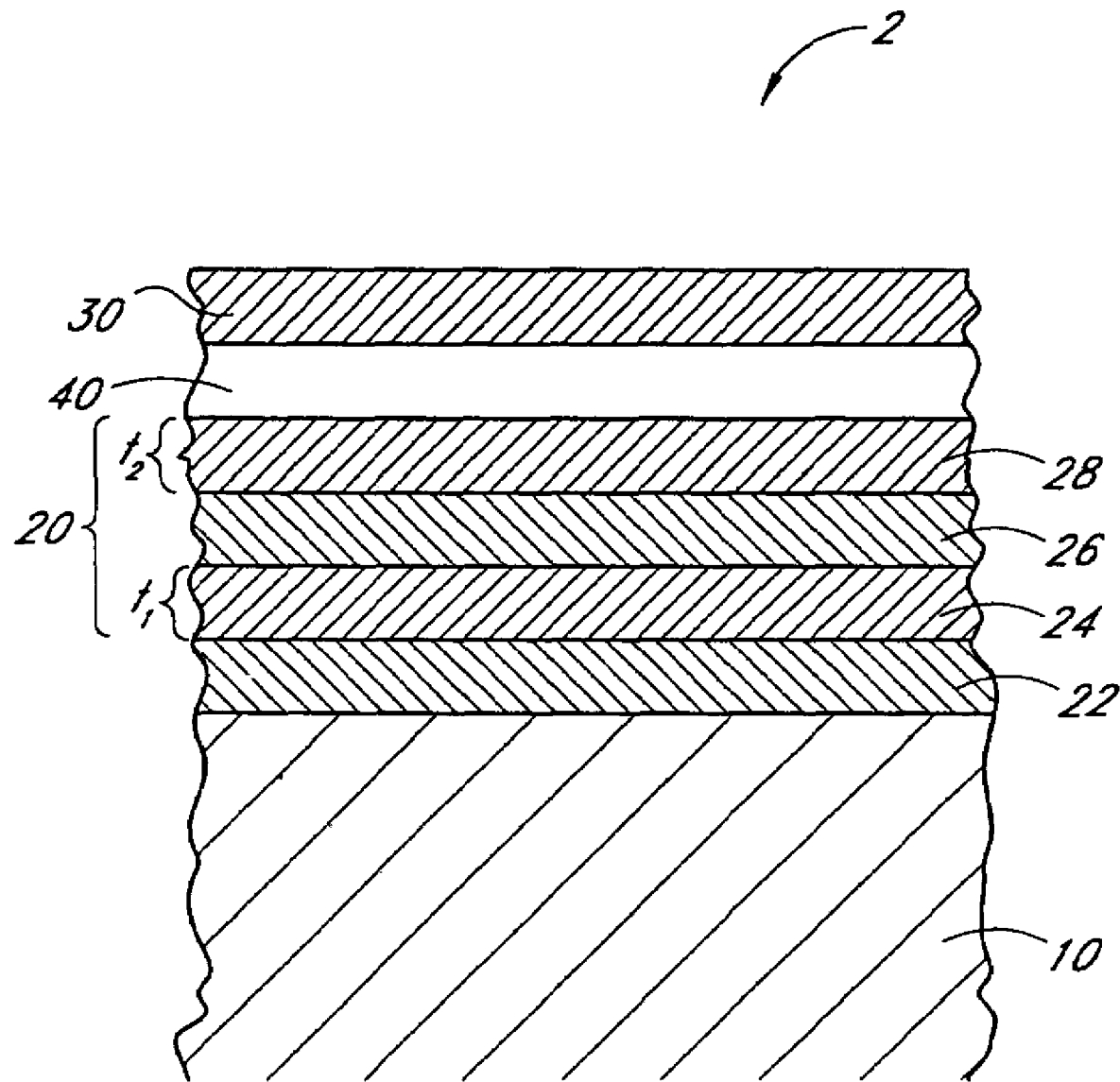
FIG. 1 schematically illustrates a cross section of a general configuration for an MRAM cell over a substrate.

The present application describes various layers of the MRAM device as being "over" other layers of the MRAM device. As used herein, the term "over" has its broadest meaning, which includes one layer having a position above the other layer. The term includes configurations in which the two layers are adjacent to one another, and configurations in which there are one or more intervening layers between the two layers. In addition, the term "layer" is used in the present application in its broadest sense, including single layers, multilayers, and adjacent groups of sublayers. While the flow diagrams herein illustrate particular embodiments with steps in a particular order, other embodiments with different orders of steps are also contemplated.

The behavior of the fixed layer 20 in an applied magnetic field during the annealing sequence can be a function of the layer thicknesses, the exchange coupling across the spacer layer 26, and the shape of the pinned layer 24. In a SAF layer, the relative thicknesses of the pinned layer 24 and the reference layer 28 can be chosen to produce a net stray magnetic field that centers the hysteresis loop of the free layer 30 (e.g., the response of the free layer 30 is symmetrical in that, during operation, the same field strength can flip the magnetization of the free layer 30 in both directions).

Certain embodiments described herein provide optimal annealing sequences based on the maximum magnetic field that can be applied during the annealing process. These optimal annealing sequences can be dependent on various equipment and device constraints. Certain other embodiments described herein facilitate optimal device parameters for SAF pinned layer structures.

FIG. 2 is a flow diagram of an embodiment of a method 100 of fabricating a fixed layer 20 for a MRAM device 2. For illustrative purposes, the following description of the method 100 refers to the exemplary elements and structure schematically illustrated by FIG. 1. The method 100 is also compatible with other configurations of the fixed layer 20 or of the MRAM device 2.

Figure 2A:
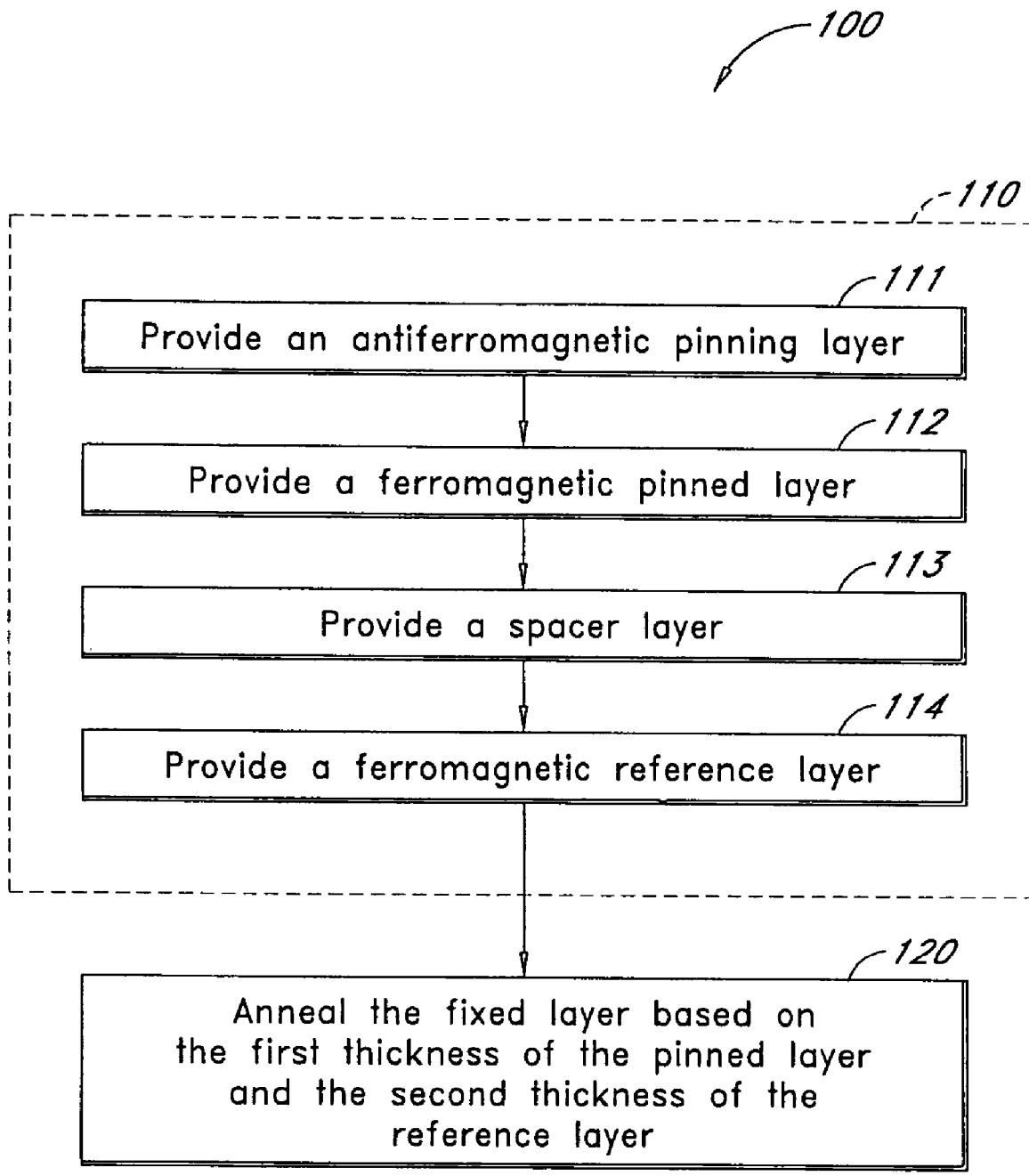
FIG. 2A is a flow diagram of an embodiment of a method of fabricating a fixed layer for a MRAM device.

In an operational block 10, a fixed layer 30 is provided. The fixed layer 30 comprises an antiferromagnetic pinning layer 22 over a substrate 10. The pinning layer 22 is provided in an operational block 111, as illustrated in FIG. 2A. As used herein, the term "substrate" or "semiconductor substrate" encompasses structures comprising semiconductor materials, including but not limited to, bulk semiconductor materials such as a semiconductor wafer (either alone or in assemblies comprising other materials thereon), and semiconductive material layers (either alone or in assemblies comprising other materials). The term "substrate" also encompasses any supporting structures, including, but not limited to, the semiconductor substrates described above. The term "substrate" also encompasses structures exposed to previous process steps used to form regions, structures, or junctions in or on the structure or foundation. In certain embodiments, the substrate 10 comprises a surface upon which a magnetic memory element will be fabricated, and can comprise, for example, layers and structures (not shown) which are known in the art for the formation of electrical circuitry. These layers include, but are not limited to, conductive layers, and insulating layers. In certain embodiments, the substrate 10 comprises silicon.

In certain embodiments, the pinning layer 22 comprises a antiferromagnetic material, e.g., IrMn, and can be formed over the substrate 10 using deposition techniques, e.g., sputter deposition, physical vapor deposition, chemical vapor deposition, and ion-beam deposition. Other exemplary materials for the pinning layer 22 include, but are not limited to, FeMn, PtMn, and NiMn. The pinning layer 22 of certain embodiments can comprise a seed layer which facilitates formation of the pinning layer 22 over the substrate 10. Exemplary materials for the seed layer include, but are not limited to, NiFe, NiFeCo, Co, and Cu. The thickness of the seed layer can be between approximately 5 Angstroms and approximately 50 Angstroms. The total thickness of the pinning layer 22 can be between approximately 50 Angstroms and approximately 1000 Angstroms.

In an operational block 112, a ferromagnetic pinned layer 24 is provided over the pinning layer 22. In certain embodiments, the pinned layer 24 comprises a ferromagnetic material and can be formed over the pinning layer 22 by various techniques, e.g., sputter deposition, physical vapor deposition, chemical vapor deposition, and ion-beam deposition. Exemplary materials for the pinned layer 24 include, but are not limited to, NiFe (permalloy), CoFe, NiFeCo, and Co. The pinned layer 24 has a first thickness $t_1$, which, in certain embodiments, can be between approximately 10 Angstroms and approximately 200 Angstroms, and in other embodiments can be between approximately 20 Angstroms and approximately 80 Angstroms.

In the operational block 113, a spacer layer 26 is provided over the pinned layer 24. In certain embodiments, the spacer layer 26 is formed over the pinned layer 24 by various techniques, e.g., sputter deposition, physical vapor deposition, chemical vapor deposition, and ion-beam deposition. Exemplary materials for the spacer layer 26 include, but are not limited to, Ru, various alloys of Ru, and Cu. The thickness of such an antiferromagnetic spacer layer 26 can be less than approximately 20 Angstroms, and in other embodiments can be between approximately 5 Angstroms and approximately 20 Angstroms. The material of the spacer layer 26 is typically a normal conducting layer (e.g., Ru), and by virtue of being sandwiched between two ferromagnetic layers and having the appropriate thickness, the spacer layer 26 provides antiferromagnetic RKKY exchange coupling between the pinned layer 24 and the reference layer 28.

In the operational block 114, a ferromagnetic reference layer 28 is provided over the spacer layer 26. In certain embodiments, the reference layer 28 comprises a ferromagnetic material and can be formed over the spacer layer 26 by various techniques, e.g., sputter deposition, physical vapor deposition, chemical vapor deposition, and ion-beam deposition. Exemplary materials for the reference layer 28 include, but are not limited to, NiFe (permalloy), CoFe, NiFeCo, and Co. The reference layer 28 has a second thickness $t_2$ which, in certain embodiments, can be between approximately 10 Angstroms and approximately 200 Angstroms, and in certain other embodiments can be approximately between approximately 20 Angstroms to approximately 80 Angstroms. In certain embodiments, the fixed layer 20 comprises the pinning layer 22, the pinned layer 24, the spacer layer 26, and the reference layer 28. In certain embodiments, the reference layer 28 comprises a dusting layer (e.g., Co), which can be between approximately 2 Angstroms and approximately 10 Angstroms in thickness. The higher spin polarization of the dusting layer can facilitate polarization of the current passing through the device 2, thereby increasing the magnetoresistance difference between the two states of the device 2.

In the operational block 120, the fixed layer 20 is annealed using a temporal temperature/magnetic field profile having a maximum magnetic field magnitude. In certain embodiments, annealing includes applying a magnetic field to the fixed layer 20 while the fixed layer 20 is at an elevated temperature. The temporal temperature/magnetic field profile represents the sequence of applied magnetic fields and temperatures as functions of time during the annealing process. In the illustrated embodiments, the profile is selected based on the first thickness of the pinned layer 24 and the second thickness of the reference layer 28.

Figure 2B:
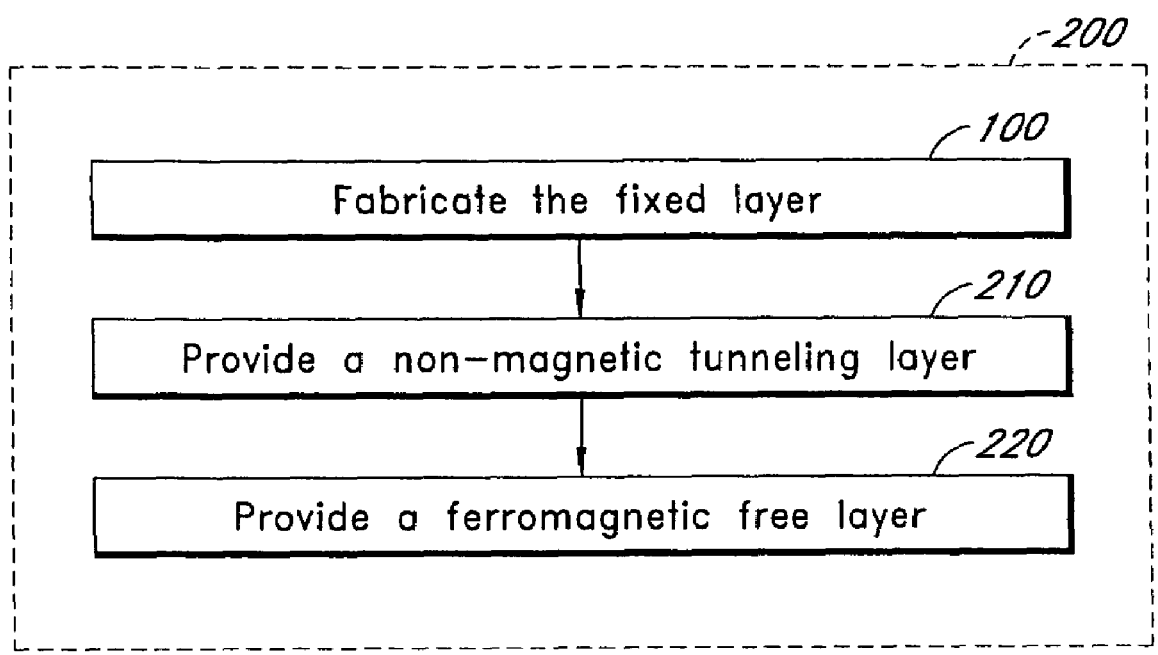
FIG. 2B is a flow diagram of an alternative embodiment of a method of fabricating a MRAM device.

In certain embodiments comprising tunneling magnetoresistive (TMR) designs, a method 200 for fabricating an MRAM device can comprise the method 100 of fabricating the fixed layer 30, and can further comprise providing a non-magnetic tunneling layer 40 over the reference layer 28 in an operational block 210, as shown in FIG. 2B. The non-magnetic tunneling layer 40 can comprise aluminum oxide (e.g., $Al_2O_3$ or other high-quality dielectric materials). Such non-magnetic tunneling layers 40 can be formed by various methods. One exemplary method includes depositing a metallic aluminum layer over the reference layer 28 and then oxidizing the aluminum layer using a known method (e.g., plasma oxidation, oxidation by air, and ion-beam oxidation). The thickness of the tunneling layer 40 in certain embodiments can be between approximately 5 Angstroms and approximately 40 Angstroms, and in certain other embodiments can be between approximately 10 Angstroms and approximately 25 Angstroms. Alternatively, the tunneling layer 40 can have a thickness between approximately 10 Angstroms and approximately 15 Angstroms, e.g., with a sufficiently thin thickness to permit tunneling of electrons therethrough. In certain embodiments, annealing the fixed layer 20 is performed prior to providing the tunneling layer 40, while in other embodiments, annealing the fixed layer 20 is performed subsequent to providing the tunneling layer 40.

In certain embodiments, the method 200 can further comprise providing a ferromagnetic free layer 30 over the tunneling layer 40 in an operational block 220. The ferromagnetic free layer 30 can comprise a ferromagnetic material, e.g., NiFeCo, CoFe, or NiFe, and can be formed over the tunneling layer 40 by various techniques, e.g., sputter deposition, physical vapor deposition, chemical vapor deposition, and ion-beam deposition. In certain embodiments, the free layer 30 comprises an amorphous material (e.g., Hf, CoFeB, or NiFeB), which advantageously provides smaller grain sizes and higher magnetoresistance difference between the two states of the device 2. The thickness of the free layer 30 can be between approximately 10 Angstroms and approximately 200 Angstroms, and in certain other embodiments can be approximately between approximately 20 Angstroms to approximately 80 Angstroms. In certain embodiments, the free layer 30 comprises a dusting layer (e.g., Co) which can be between approximately 2 Angstroms and approximately 10 Angstroms in thickness. In certain embodiments, annealing the fixed layer 20 is performed prior to providing the free layer 30, while in other embodiments, annealing the fixed layer 20 is performed subsequent to providing the free layer 30.

Imperfections in the smoothness of the pinned layer 24 and the reference layer 28 can generate stray magnetic fields which, via Neel coupling, can offset or shift the hysteresis loop and the switching field of the device 2. This offset of the hysteresis loop can be compensated by appropriate selection of the relative thicknesses of the pinned layer 24 and of the reference layer 28. See, e.g., B. D. Schrag et al., "Neel 'orange-peel' coupling in magnetic tunnel junction devices," *Applied Physics Letters*, Vol. 77, No. 15, Oct. 2000, pp. 2373–2375, which is incorporated in its entirety by reference herein. In such systems, the first thickness $t_1$, of the pinned layer 24 and the second thickness $t_2$ of the reference layer 28 can be chosen to accommodate considerations of bit size, bit shape, and to center the hysteresis loop about zero. For low Neel coupling (e.g., less than about 3 oersteds), $t_1 > t_2$ can be used. For intermediate values of Neel coupling, $t_1 = t_2$ can be used, and for large Neel coupling, $t_2 > t_1$ can be used.

The total magnetization moment of the fixed layer 20 can be calculated as a function of the relative thicknesses of the pinned layer 24 and the reference layer 28 and the magnitude of the magnetic field applied to the fixed layer 20. The calculations reflect a competition between the energy of aligning the magnetizations of the pinned layer 24 and the reference layer 28 with the exchange energy across the spacer layer 26. An exemplary model for the calculations can be based on a 800 nm×400 nm elliptical MRAM bit with a pinned layer 24, a spacer layer 26, and a reference layer 28. For a generic discussion about micromagnetic modeling, see W. F. Brown and A. E. LaBonte, *Journal of Applied Physics*, Vol. 36, No. 4, 1965, p. 1380, which is incorporated in its entirety by reference herein. The applied magnetic field can be modeled to be held constant at a selected value while the temperature of the fixed layer 20 is modeled to be cooled from above the blocking temperature of the pinning layer 22 back down to room temperature. The exemplary calculations presented herein are representative of the general response of fixed layers 20 of MRAM devices 2 to various annealing profiles.

Figure 3A:
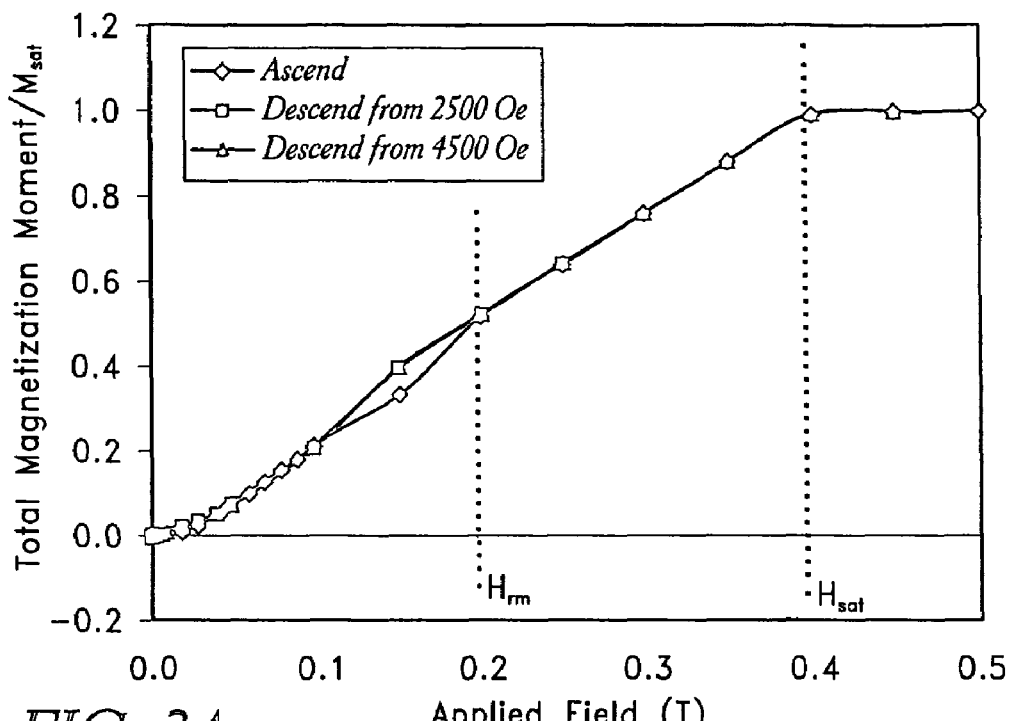
FIG. 3A is a graph of the magnitude of the total magnetization moment $M_{sat}$ of the fixed layer having a first thickness of the pinned layer substantially equal to the second thickness of the reference layer ($t_1 = t_2$).
Figure 3B:
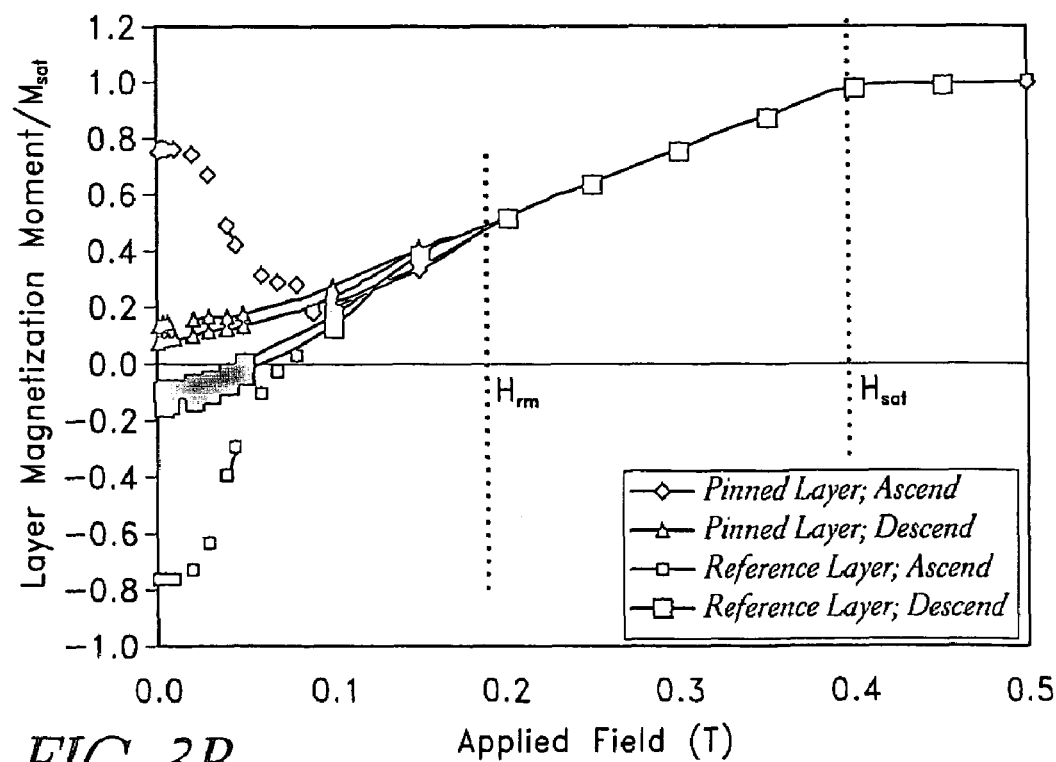
FIG. 3B is a graph of the magnetizations of the pinned layer and the reference layer corresponding to FIG. 3A.
Figure 3C:
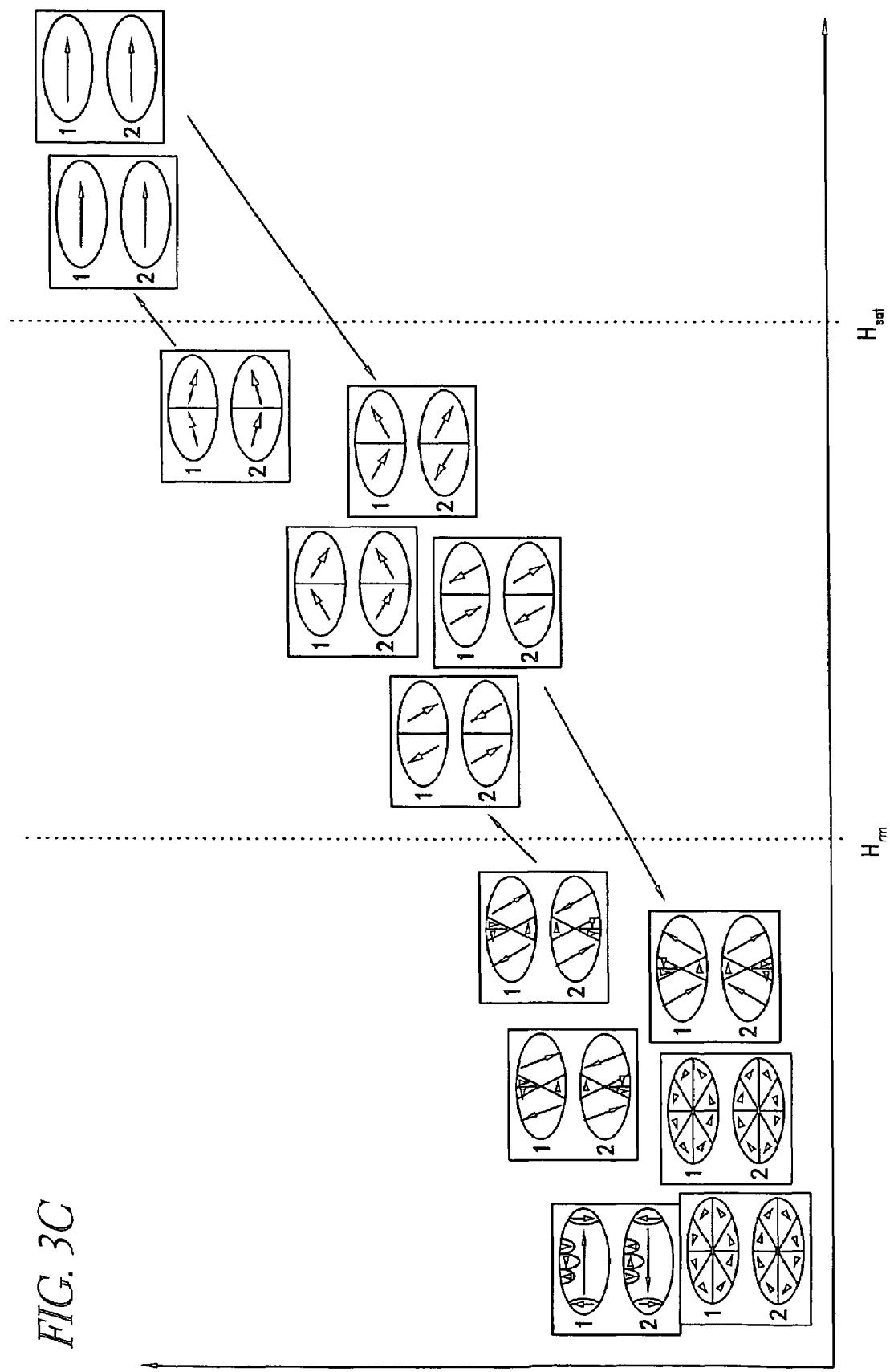
FIG. 3C schematically illustrates the orientations of the magnetization domains of the pinned layer and the reference layer corresponding to FIG. 4A.

FIG. 3A is a graph of the magnitude of the total magnetization moment for the fixed layer 20 having a first thickness of the pinned layer 24 substantially equal to the second thickness of the reference layer 28 ($t_1 = t_2$). The MRAM bit is modeled to have a pinned layer 24 comprising cobalt-iron (CoFe) approximately 40 Angstroms thick, a spacer layer 26 comprising ruthenium approximately 7 Angstroms thick, and a reference layer 28 comprising cobalt-iron ($Co_{60}Fe_{40}$) approximately 40 Angstroms thick. The total magnetization moment is illustrated in FIG. 3A as a function of the magnetic field applied to the fixed layer 20 during the anneal. FIG. 3B is a graph of the corresponding magnetizations of the pinned layer 24 and the reference layer 28. To illustrate any history dependence (hysteresis) of the magnetization, data are shown in FIGS. 3A and 3B for ascending applied fields and descending applied fields from two maximum values (2500 oersteds and 4500 oersteds). FIG. 3C schematically illustrates the corresponding orientations of the magnetization domains of the pinned layer 24 (signified by ellipse 1) and the reference layer 28 (signified by ellipse 2).

Each data point in FIGS. 3A and 3B corresponds to a calculation of the magnetizations of the pinned layer 24 and the reference layer 28 resulting from heating the fixed layer 20, applying an external magnetic field generally parallel to the long axis of the MRAM bit, and then cooling the fixed layer 20 while the magnetic field is applied. By heating the fixed layer 20 to a temperature above the blocking temperature of the antiferromagnetic material of the pinning layer 22 (e.g., above 200° C.), the antiferromagnetic pinning layer 22 is no longer pinning, so the spins of the two ferromagnetic layers (pinned layer 24 and reference layer 28) are free to orient. Cooling the temperature down to room temperature while the field is applied freezes in the spin arrangement of the ferromagnetic layers, resulting in the magnetization of the layers.

The dependence of the total magnetization and the layer magnetizations on the applied magnetic field shown in FIGS. 3A–3C can be separated into generally three magnetic field regimes defined by two field boundaries. For magnetic fields greater than Hsat (e.g., greater than approximately 0.4 T in FIGS. 3A–3C), the total magnetization moment is generally uniformly saturated at a value $M_{sat}$. The magnetic field $H_{sat}$ is defined as the minimum field for generally uniform saturation. In this regime, the magnetizations of the pinned layer 24 and the reference layer 28 are each substantially uniform with a single magnetic domain with a magnetization orientation substantially parallel to the long axis of the MRAM bit (i.e., along the direction of the applied magnetic field).

For magnetic fields less than $H_{rm}$ (e.g., less than approximately 0.2 T in FIGS. 3A–3C), the total magnetization increases monotonically and generally non-linearly with the applied magnetic field. The magnetic field $H_{rm}$ is defined as the minimum applied magnetic field for avoiding trapping of domain walls (e.g., trapping vortices or reversed magnetization). For example, vortices generated in this regime have relatively small stray fields outside the layers, but the layers have multiple domains with magnetizations which are rotated relative to one another, increasing the exchange energy within the layer. Thus, the stray field energy is reduced in this regime at the expense of the intralayer exchange energy. As illustrated by FIG. 3B, this regime has significant hysteresis effects, as evidenced by the magnetizations of the pinned layer 24 and the reference layer 28, which are each dependent on the history of the applied magnetic fields (e.g., whether the applied field is ascending or descending).

As illustrated by FIG. 3C, the magnetization of the pinned layer 24 in the regime below $H_{rm}$ is not substantially uniform and has multiple domains of magnetization. Similarly, the magnetization of the reference layer 28 in this regime also is not substantially uniform and has multiple domains. The domains of the pinned layer 24 generally correspond to the domains of the reference layer 28, but with opposite magnetizations. The pinned layer 24 and the reference layer 28 each have trapped magnetization vortices and/or domain walls. In general, it is preferable to avoid multiple domains, vortices, domain walls, and reversed magnetization, etc. since these features reduce the total magnetization of the fixed layer 20, thereby reducing the magnetoresistance difference between the "1" state and the "0" state of the MRAM bit. In addition, the resultant stray fields can effect the ability of writing to the MRAM bit, such that the bit does not respond appropriately to the applied field. Certain embodiments avoid having $M_{sat1} \times t_1 = M_{sat2} \times t_2$, since under this condition, such domain walls may be trapped in the fixed layer 20 after annealing.

For applied magnetic fields greater than $H_{rm}$ and less than $H_{sat}$ (e.g., greater than approximately 0.2 T and less than approximately 0.4 T in FIGS. 3A–3C), the total magnetization increases generally linearly with the applied magnetic field, as illustrated in FIG. 3A. In this regime, the two ferromagnetic layers each have two generally uniformly magnetized domains.

The net magnetizations of the two ferromagnetic layers are influenced by the competition between the Zeeman energy, which is minimized when the net magnetizations are parallel to one another and to the applied field, and the antiferromagnetic exchange energy, which is minimized when the net magnetizations are antiparallel to one another. Comparing the net magnetizations of the pinned layer 24 and the reference layer 28, the two layers have net magnetizations which point in generally opposite directions to one another for lower applied fields (i.e., near $H_{rm}$). This behavior is a consequence of the effects of interlayer exchange coupling between the pinned layer 24 and the reference layer 28. For higher applied fields (i.e., as $H_{sat}$ is approached), the net magnetizations rotate to be more parallel to one another and more parallel to the applied magnetic field. By increasing the applied field, the intralayer exchange energy is overcome, and the net magnetization of the layer becomes more uniform and parallel to the applied field. The net magnetizations in this regime can scissor through the creation of C-states in each of the two ferromagnetic layers. See, e.g., U.S. Pat. No. 5,841,692 issued to Gallagher et al., entitled "Magnetic tunnel junction device with antiferromagnetically coupled pinned layer," which is incorporated in its entirety by reference herein.

As described above, the relative thicknesses of the pinned layer 24 and the reference layer 28 may be selected to center the hysteresis loop. In certain such embodiments, the thicknesses of the two layers can be approximately equal to one another. As illustrated by FIGS. 3A–3C, for conditions in which the first thickness $t_1$ is approximately equal to the second thickness $t_2$, it is preferable to field cool the fixed layer 20 while a magnetic field greater than $H_{sat}$ is applied. Such a temporal temperature/magnetic field profile can result in substantially uniform saturation of the total magnetization ($M_{sat}$) and the magnetizations of the pinned layer 24 and the reference layer 28.

If the first thickness $t_1$ is approximately equal to the second thickness $t_2$ and the maximum magnetic field applied to the fixed layer 30 is constrained to be less than $H_{sat}$, then the heat of subsequent processing steps may result in reduction or loss of the magnetization of the two ferromagnetic layers. Therefore, it is preferable in such conditions to not anneal the fixed layer 30 once the magnetization of the fixed layer 20 has been set (e.g., set the fixed layer magnetization after the patterning or other processing steps. The maximum magnetic field can be constrained due to the availability of devices that provide magnetic fields greater than or equal to the $H_{sat}$ of the MRAM bits.

Figure 4A:
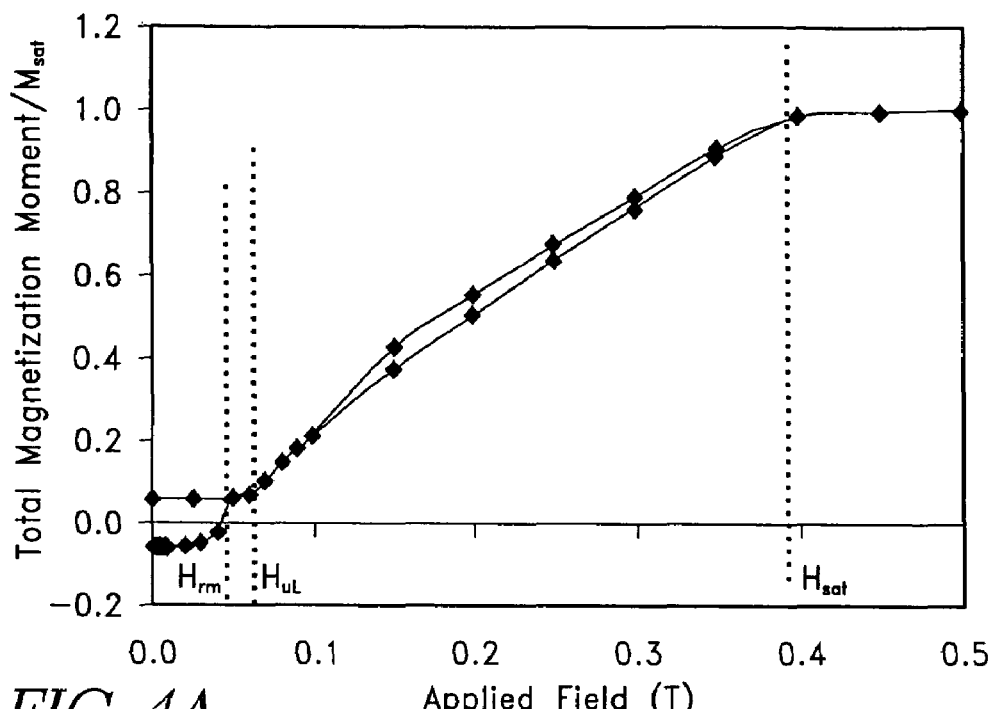
FIG. 4A is a graph of the magnitude of the total magnetization moment $M_{sat}$ of the fixed layer having a first thickness of the pinned layer substantially greater than the second thickness of the reference layer ($t_1 > t_2$).
Figure 4B:
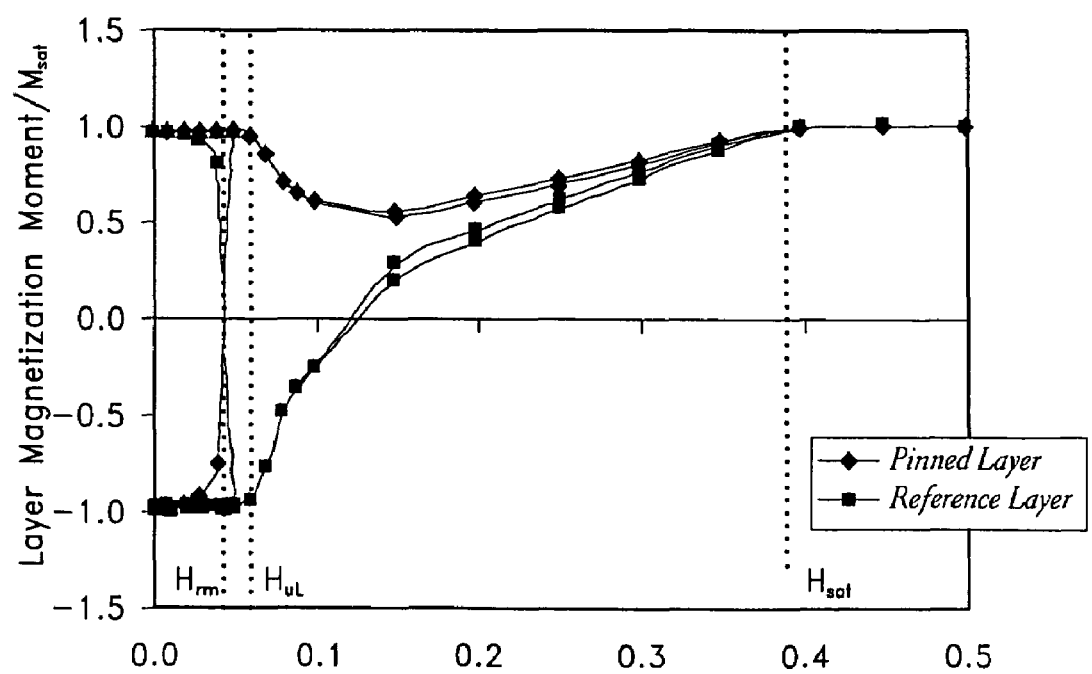
FIG. 4B is a graph of the magnetizations of the pinned layer and the reference layer corresponding to FIG. 4A.

FIG. 4A is a graph of the magnitude of the total magnetization moment for the fixed layer 20 having a first thickness of the pinned layer 24 substantially greater than the second thickness of the reference layer 28 ($t_1 > t_2$). The MRAM bit is modeled to have a pinned layer 24 comprising cobalt-iron (CoFe) approximately 45 Angstroms thick, a spacer layer 26 comprising ruthenium approximately 7 Angstroms thick, and a reference layer 28 comprising cobalt-iron (CoFe) approximately 40 Angstroms thick. FIG. 4B is a graph of the corresponding layer magnetizations of the pinned layer 24 and the reference layer 28.

Figure 5A:
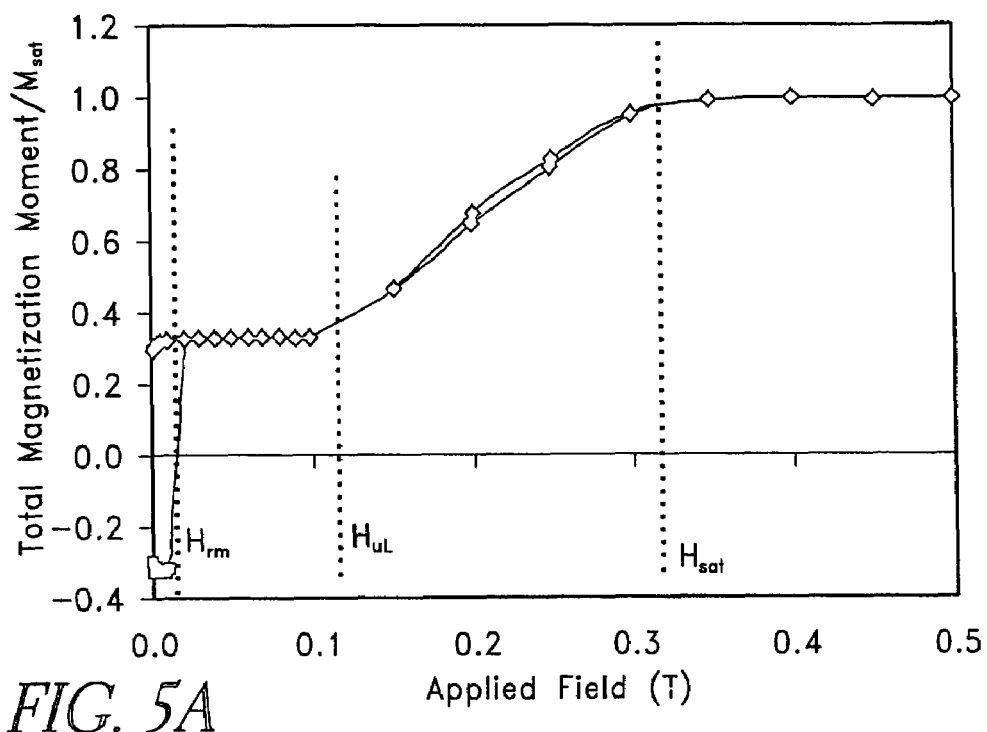
FIG. 5A is a graph of the magnitude of the total magnetization moment $M_{sat}$ of the fixed layer having a first thickness of the pinned layer substantially much greater than the second thickness of the reference layer ($t_1 >> t_2$).
Figure 5B:
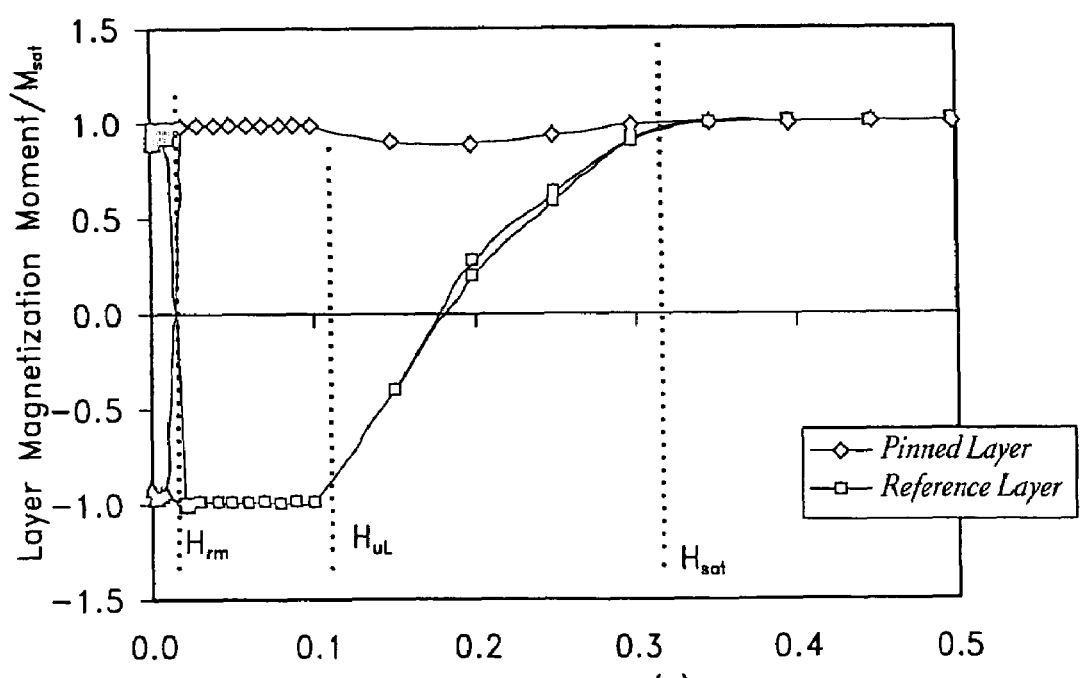
FIG. 5B is a graph of the magnetizations of the pinned layer and the reference layer corresponding to FIG. 5A.
Figure 5C:
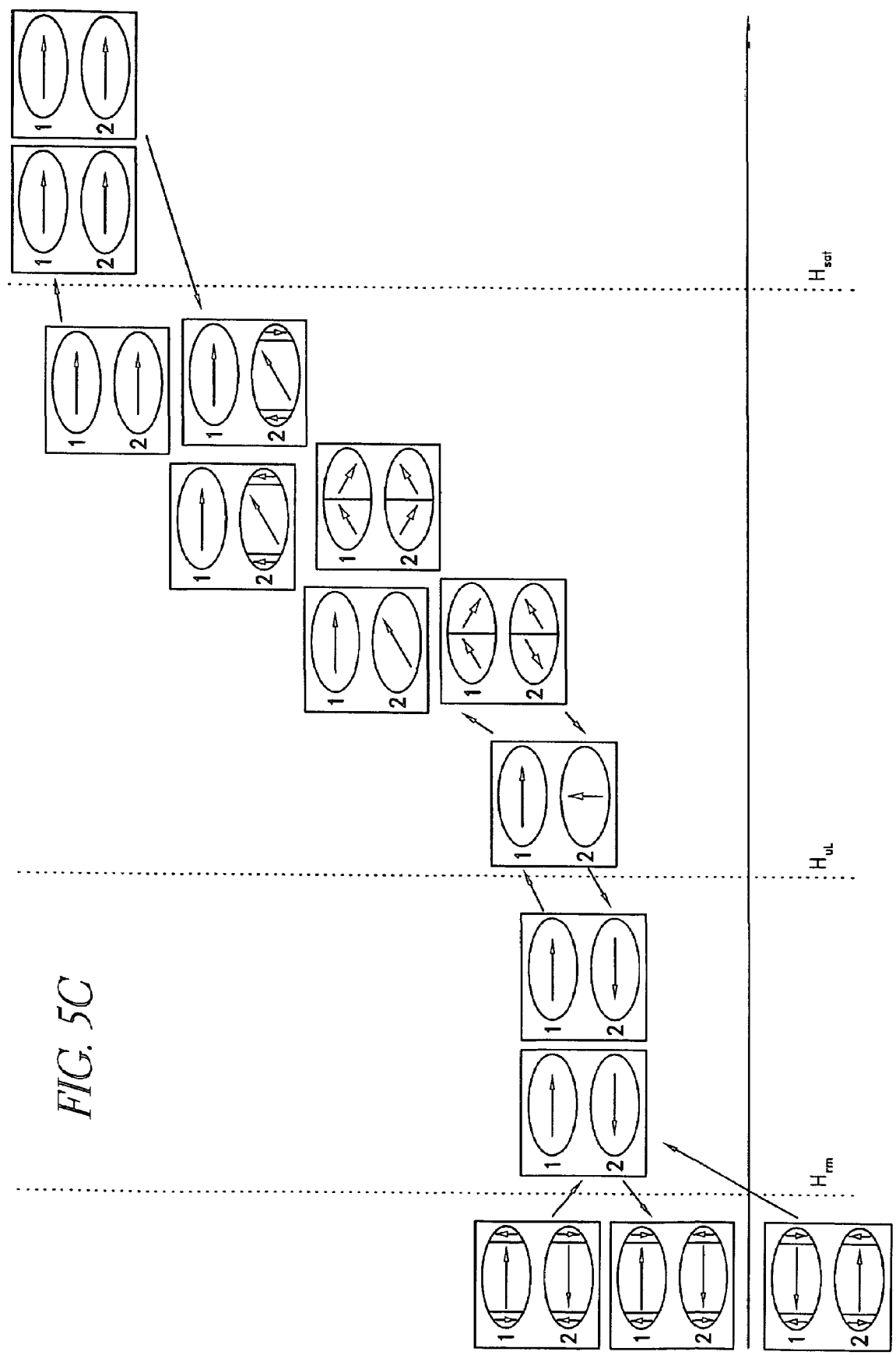
FIG. 5C schematically illustrates the orientations of the magnetization domains of the pinned layer and the reference layer corresponding to FIG. 5A.

FIG. 5A is a graph of the magnitude of the total magnetization moment for the fixed layer 20 having a first thickness of the pinned layer 24 substantially much greater than the second thickness of the reference layer 28 ($t_1 \gg t_2$). The MRAM bit is modeled to have a pinned layer 24 comprising cobalt-iron (CoFe) approximately 80 Angstroms thick, a spacer layer 26 comprising ruthenium approximately 7 Angstroms thick, and a reference layer 28 comprising cobalt-iron (CoFe) approximately 40 Angstroms thick. FIG. 5B is a graph of the corresponding layer magnetizations of the pinned layer 24 and the reference layer 28. FIG. 5C schematically illustrates the corresponding orientations of the magnetization domains of the pinned layer 24 (signified by ellipse 1) and the reference layer 28 (signified by ellipse 2).

The dependence of the total magnetization and the layer magnetizations on the applied magnetic field shown in FIGS. 4A, 4B, 5A, 5B, and 5C can be separated into generally four magnetic field regimes defined by three field boundaries. In these various regimes, it is generally true that the magnetization of the thicker layer (i.e., the reference layer 28) is generally parallel to the applied magnetic field. At low fields, the magnetization of the thinner layer (i.e., the pinned layer 24) is generally antiparallel to the applied magnetic field.

For magnetic fields greater than $H_{sat}$ (e.g., greater than approximately 0.4 T in FIGS. 4A and 4B and greater than approximately 0.32 T in FIGS. 5A–5C), the total magnetization moment is generally uniformly saturated at a value $M_{sat}$ with alignment generally along the long axis of the MRAM bit (i.e., the direction of the applied magnetic field). In this regime, the magnetizations of the pinned layer 24 and the reference layer 28 are each substantially uniform with a single magnetic domain with a magnetization orientation substantially parallel to that of the other layer.

The magnetic field $H_{uL}$ is defined as the low field uniform magnetization boundary. For magnetic fields greater than $H_{uL}$ but less than $H_{sat}$, the magnetization of the fixed layer 20 scissors through the creation of C, S, or uniform rotated states. The long axis component of the magnetization of the reference layer 28 is oriented substantially along the applied field direction. The magnetization of the pinned layer 24 experiences a rotation from fields near $H_{uL}$ in which its long axis component is substantially opposite or perpendicular to the applied field, to fields near $H_{sat}$ in which its long axis component is substantially along the applied field direction.

For magnetic fields greater than $H_{rm}$ and less than $H_{uL}$, the magnetization is relatively uniform in both the pinned layer 24 and the reference layer 28. The orientations of the magnetizations of these two layers are substantially opposite to one another in this regime, with the magnetization of the reference layer 28 substantially along the applied field direction along the long axis of the MRAM bit. For magnetic fields less than $H_{rm}$, it is possible to trap undesirable magnetization states (e.g., vortices).

As illustrated by FIGS. 4A, 4B, and 5A–5C, for conditions in which the first thickness $t_1$ is substantially greater than the second thickness $t_2$, the calculations indicate that it is preferable to field cool the fixed layer 20 while a magnetic field greater than $H_{sat}$ is applied, in embodiments in which such high fields are available to be applied. The calculations also indicate that increasing the mismatch between $t_1$ and $t_2$ can move the $H_{uL}$ boundary to higher magnetic fields (e.g., from approximately 0.06 T to approximately 0.12 T).

In certain embodiments in which $t_1 > t_2$, fields greater than $H_{sat}$ may not be available, but fields greater than $H_{uL}$ may be available. In certain such embodiments, the first thickness $t_1$ can be selected to be substantially greater than the second thickness $t_2$, and the fixed layer 30 is preferably soaked at the maximum applied magnetic field available and field cooled with an applied magnetic field between $H_{rm}$ and $H_{uL}$. In certain such embodiments, the first thickness $t_1$ can be selected to center the hysteresis loop. Such a temporal temperature/magnetic field profile can result in substantially uniform saturation of the total magnetization and the magnetizations of the pinned layer 24 and the reference layer 28.

In embodiments in which $t_1 > t_2$ and fields greater than $H_{uL}$ are not available, but fields greater than $H_{rm}$ are available, the fixed layer 30 is preferably field cooled with an applied magnetic field between $H_{rm}$ and $H_{uL}$. In embodiments in which the maximum magnetic field applied to the fixed layer 30 is constrained to be less than $H_{rm}$, it is preferable to not anneal the fixed layer 30 or to set the antiferromagnetic pinning layer 22 post patterning.

In certain embodiments, to set the magnetization orientation of the pinned layer 24, a pinning field can be produced by the antiferromagnetic pinning layer 22. The pinning field can be set by field cooling the pinning layer 22 from a temperature above the blocking temperature to a temperature near room temperature. The blocking temperature is primarily a function of the material of the antiferromagnetic pinning layer 22, but can also depend on the thickness of the layer or the grain sizes within the layer. Because the pinning layer 22 is exchange coupled to the pinned layer 24, the pinning field in the pinned layer 24 is influenced by the spin arrangement at the interface between the pinning layer 22 and the pinned layer 24. Therefore, in certain embodiments, the pinning layer 22 is field cooled in a net magnetic field that is oriented in the same direction as the magnetization of the pinned layer 24. If this condition is not satisfied, the pinning layer 22 may be set at an angle (e.g., canted) to the bit easy axis (e.g., the long axis of the bit), which could result in poor switching behavior or reduced tunneling magnetoresistance by reducing the component of the magnetization of the free layer 30 parallel or antiparallel to the magnetization of the fixed layer 20.

The magnetic field experienced by the pinning layer 22 during field cooling has several contributions which include, but are not limited to, demagnetization from stray magnetic fields eminating from the pinned layer 24, the reference layer 28, and the free layer 30, interlayer exchange, intralayer exchange between the pinned layer 24 and the pinning layer 22, and external fields applied during cooling. It is the competition between these various contributions which results in the magnetization patterns observed in the fixed layer 20. For example, the antiferromagnetic pinning layer 22 can experience demagnetization from the reference layer 28, direct magnetization from the externally applied magnetic field, and demagnetization plus exchange coupling from the pinned layer 24. These effects can result in the pinning layer 22 being nonuniform or canted and can result in reduced pinning field magnitude.

Generally, field cooling is performed at an applied magnetic field magnitude at which the magnetization of the pinned layer 24 is uniform and oriented in the same direction as the applied magnetic field, thereby avoiding a canted, nonuniform, or reduced pinning field. In certain embodiments, the fixed layer 20 is soaked at high temperatures and high applied magnetic fields before cooling. Typical times for such soaking can be on the order of a few minutes to a few hours. Such procedures can make the magnetization homogeneous and can set the proper direction of the SAF layers. The applied magnetic field preferably has a magnitude greater than $H_{sat}$. In certain embodiments, the relative thicknesses of the pinned layer 24 and the reference layer 28 are selected so that $t_1 > t_2$. Such embodiments provide more freedom in the choice of the annealing process by virtue of the uniform saturation achievable at lower magnitudes of the applied magnetic field.

Table 1 provides a set of guidelines which can be used in certain embodiments to determine an optimum annealing procedure based on the relative thicknesses of the pinned layer 24 and the reference layer 28. Certain such embodiments provide magnetizations of the pinned layer 24 and the reference layer 28 which are generally uniform and generally along the direction of the applied magnetic field (i.e., along the long axis of the MRAM bit). The first column of Table 1 indicates the relation between the first thickness $t_1$ of the pinned layer 24 and the second thickness $t_2$ of the reference layer 28. The second column indicates whether there is a constraint on the maximum applied magnetic field magnitude. The third column provides an annealing procedure which can provide a desired magnetization. References to "$-H_{rm}$" refer to applied magnetic fields in the opposite direction from the direction of the magnetization desired in the fixed layer 20.

TABLE 1

| Configuration | Constraint | Annealing Procedure |
| --- | --- | --- |
| $t_1 = t_2$ | None | Field cool with $H > H_{sat}$ |
| | $H_{anneal} < H_{sat}$ | Do not anneal after patterning or set the antiferromagnetic pinning layer after patterning |
| $t_1 > t_2$ | None | Field cool with $H > H_{sat}$ |
| | $H_{anneal} < H_{sat}$ | Soak at maximum $H_{anneal}$; Field cool with $H_{rm} < H_{anneal} < H_{uL}$ |
| | $H_{anneal} < H_{uL}$ | Anneal and field cool at $H_{anneal} > H_{rm}$ |
| | $H_{anneal} < H_{rm}$ | Do not anneal after patterning or set the antiferromagnetic pinning layer after patterning |
| $t_1 < t_2$ | None | Field cool with $H > H_{sat}$ |
| | $H_{anneal} < H_{sat}$ | Soak at maximum $H_{anneal}$; cool with no applied field, or with $-H_{rm}$ |
| | $H_{anneal} < H_{uL}$ | Soak at maximum $H_{anneal}$; cool with no applied field or with $-H_{rm}$ |
| | $H_{anneal} < H_{rm}$ | Do not anneal after patterning or set the antiferromagnetic pinning layer after patterning |

Various embodiments of the present invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

What is claimed is:

1. A method for fabricating an MRAM device, the method comprising:
providing a fixed layer, the fixed layer comprising:
an antiferromagnetic pinning layer over a substrate;
a ferromagnetic pinned layer over the pinning layer, the pinned layer having a first thickness;
a spacer layer over the pinned layer;
a ferromagnetic reference layer over the spacer layer, the reference layer having a second thickness; and
selecting magnetic field conditions for setting a magnetic orientation of the fixed layer, the magnetic field conditions selected based on the first thickness of the pinned layer and the second thickness of the reference layer.

2. The method of claim 1, further comprising providing a non-magnetic tunneling layer over the fixed layer.

3. The method of claim 2, further comprising providing a ferromagnetic free layer over the tunneling layer.

4. The method of claim 1, further comprising soaking and/or field cooling the fixed layer after selecting.

5. The method of claim 4, wherein the magnetic field conditions have a maximum magnetic field magnitude ($H_{anneal}$).

6. The method of claim 5, wherein $H_{anneal}$ is not constrained to be less than a minimum field for uniform saturation ($H_{sat}$).

7. The method of claim 6, wherein if the first thickness is substantially equal to the second thickness, field cooling the fixed layer is conducted using an applied magnetic field greater than $H_{sat}$.

8. The method of claim 7, wherein if the first thickness is substantially greater than the second thickness, field cooling is conducted with an applied magnetic field greater than $H_{sat}$.

9. The method of claim 8, wherein if the first thickness is substantially less than the second thickness, field cooling is conducted with an applied magnetic field greater than $H_{sat}$.

10. The method of claim 5, wherein $H_{anneal}$ is constrained to be less than a minimum field for uniform saturation ($H_{sat}$).

11. The method of claim 10, wherein if the first thickness is substantially greater than the second thickness, soaking with $H_{anneal}$ and field cooling are conducted with an applied magnetic field greater than a maximum field for trapping vortices or reversed magnetization ($H_{rm}$) and less than a low field uniform magnetization boundary ($H_{uL}$).

12. The method of claim 11, wherein if the first thickness is substantially less than the second thickness, soaking with $H_{anneal}$ and field cooling are conducted without an applied magnetic field.

13. The method of claim 11, wherein if the first thickness is substantially less than the second thickness, soaking with $H_{anneal}$ and field cooling are conducted with an applied magnetic field equal to the negative of a maximum field for trapping vortices or reversed magnetization ($-H_{rm}$).

14. The method of claim 5, wherein $H_{anneal}$ is constrained to be less than a low field uniform magnetization boundary ($H_{uL}$).

15. The method of claim 14, wherein if the first thickness is substantially greater than the second thickness, field cooling is conducted with an applied magnetic field greater than a maximum field for trapping vortices or reversed magnetization ($H_{rm}$).

16. The method of claim 15, wherein if the first thickness is substantially less than the second thickness, soaking with $H_{anneal}$ and field cooling are conducted without an applied magnetic field.

17. The method of claim 16, wherein if the first thickness is substantially less than the second thickness, soaking with $H_{anneal}$ and field cooling are conducted with an applied magnetic field equal to the negative of $H_{rm}$ ($-H_{rm}$).

* * * * *

UNITED STATES PATENT AND TRADEMARK OFFICE
CERTIFICATE OF CORRECTION

PATENT NO. : 7,160,738 B2  Page 1 of 1
APPLICATION NO. : 11/415601
DATED : January 9, 2007
INVENTOR(S) : James G. Deak It is certified that error appears in the above-identified patent and that said Letters Patent is hereby corrected as shown below:

First Page Column 2 (U.S. Patent Documents); Line 1; After "6,707,084" delete "B1" and insert -- B2 --, therefor.

First Page Column 2 (U.S. Patent Documents); Line 2; After "6,744,086" delete "B1" and insert -- B2 --, therefor.

Column 3; Line 60; After "block" delete "10," and insert -- 110, --, therefor.

Column 4; Line 39; After "thickness" delete "$t_1$," and insert -- $t_1$ --, therefor.

Column 6; Line 19; After "thickness" delete "$t_1$," and insert -- $t_1$ --, therefor.

Column 7; Line 20; Delete "Hsat" and insert -- $H_{sat}$ --, therefor.

Signed and Sealed this

Second Day of February, 2010

David J. Kappos
*Director of the United States Patent and Trademark Office*